United States Patent [19]
Chilton et al.

[11] Patent Number: 5,923,865
[45] Date of Patent: Jul. 13, 1999

[54] EMULATION SYSTEM HAVING MULTIPLE EMULATED CLOCK CYCLES PER EMULATOR CLOCK CYCLE AND IMPROVED SIGNAL ROUTING

[75] Inventors: John Chilton, Soquel; Tony Sarno, Scotts Valley; Ingo Schaefer, Sunnyvale, all of Calif.

[73] Assignee: Quickturn Design Systems, Inc., Mountain View, Calif.

[21] Appl. No.: 08/496,239

[22] Filed: Jun. 28, 1995

[51] Int. Cl.$^6$ .............................. G06F 17/50; G06F 3/00
[52] U.S. Cl. .................... 395/500; 364/578; 364/488; 364/490; 364/491
[58] Field of Search .................................. 395/500, 578, 395/183, 183.1; 364/488–491

[56] References Cited

U.S. PATENT DOCUMENTS

| | | | |
|---|---|---|---|
| 3,955,180 | 5/1976 | Hirtle | 395/500 |
| 4,306,286 | 12/1981 | Cocke et al. | 395/500 |
| 4,357,678 | 11/1982 | Davis | 326/39 |
| 4,527,249 | 7/1985 | Van Brunt | 364/578 |
| 4,583,169 | 4/1986 | Cooledge | 364/491 |

(List continued on next page.)

OTHER PUBLICATIONS

U.S. Patent Application No. 08/067,571 Abandoned, M.N Wang et al.
U.S. Patent Application No. 08/197,430 Patented, Han Kuijston, patent #5,680,583.
U.S. Patent Application No. 08/242,164 Abandoned, Parent of FNC, Han Kuijston, 08/748,154.
Goering, R., "Emulation for the masses", Electronic Engineering Times, Jan. 29, 1996, p. 63.
Virtual Wires: A Technology for Massive Multi–FPGA Systems Anant Agarawal, Virtual Machine Works inc.
Agarwal, Anant, "Virtual Wires™: a Technology for Massive Multi–FPGA Systems", Virtual Marchine Works (no publication date given).
Sim Express TM "Hardware Emulator", Virtual Machine Works pp. 1–24.
Maliniak, L "Pin Multiplexing Yields Low–Cost Logic Emulation", Electronic Design, Jan. 22, 1996.
"Virtual Wires Published Papers", Various Dates, http://cag–www.LCS.mit.edu/VW.res/papers/index. control) pp. 1–2, various authors.
"VHDL Mixed–Level Fault Simulator", pp. 1–7, http://www.ikos.com, Mar. 26, 1997.
VistualLogic SLI Emulation System", VirtualLogic SLI", N/A (no publication date given) pp. 1–4, Lingo et al http://www.ikos.com/products/VSIi.
"Logic Emulation for the Masses Arrives", Sep. 16, 1996, pp. 1–3, Lingo et al, http://www.ikos.com.
"IKOS Systems to Acquire Virtual Machine Works", Mar. 11, 1996, Lingo et al pp. 1–2, http://www.ikos.com/.

*Primary Examiner*—Kevin J. Teska
*Assistant Examiner*—Herbert McNair
*Attorney, Agent, or Firm*—Lyon & Lyon LLP

[57] ABSTRACT

A logic emulation system for emulating the operation of a circuit. A uniform routing architecture is provided where a first set of selectors (multiplexers) is coupled to a set of shift registers that are in turn coupled to a second set of selectors. The outputs of the second set of selectors are coupled to the inputs of the logic processors. The arrangement of first selectors coupled to shift registers coupled to second selectors coupled to logic processors ensures that uniform routing exists among all of the logic processors in the emulation system. This, in turn, provides a flat programming model so that compilation steps including technology mapping and scheduling are independent of each other, resulting in faster compile times.

1 Claim, 18 Drawing Sheets

U.S. PATENT DOCUMENTS

| | | | |
|---|---|---|---|
| 4,587,625 | 5/1986 | Marino et al. | 364/578 |
| 4,656,580 | 4/1987 | Hitchcock et al. | 395/500 |
| 4,695,968 | 9/1987 | Sullivan et al. | 364/578 |
| 4,697,241 | 9/1987 | Lavi | 364/488 |
| 4,725,971 | 2/1988 | Doshi et al. | 364/578 |
| 4,769,817 | 9/1988 | Kron et al. | 291/18 |
| 4,782,461 | 11/1988 | Mick et al. | 395/500 |
| 4,787,061 | 11/1988 | Nei et al. | 395/500 |
| 4,787,062 | 11/1988 | Nei et al. | 395/500 |
| 4,819,150 | 4/1989 | Jennings et al. | 395/500 |
| 4,862,347 | 8/1989 | Rudy | 395/500 |
| 4,879,646 | 11/1989 | Iwasaki et al. | 395/568 |
| 4,914,612 | 4/1990 | Beece et al. | 364/578 |
| 4,972,334 | 11/1990 | Yamabe et al. | 395/500 |
| 5,031,129 | 7/1991 | Powell et al. | 364/717.04 |
| 5,036,473 | 7/1991 | Butts et al. | 364/489 |
| 5,068,812 | 11/1991 | Schaefer et al. | 364/578 |
| 5,084,824 | 1/1992 | Lam et al. | 364/490 |
| 5,109,353 | 4/1992 | Sample et al. | 364/578 |
| 5,114,353 | 5/1992 | Sample | 439/65 |
| 5,126,966 | 6/1992 | Hafeman et al. | 364/500 |
| 5,259,006 | 11/1993 | Price et al. | 375/356 |
| 5,321,828 | 6/1994 | Phillips et al. | 395/500 |
| 5,329,470 | 7/1994 | Sample et al. | 364/578 |
| 5,329,471 | 7/1994 | Swoboda et al. | 364/578 |
| 5,331,571 | 7/1994 | Aronoff et al. | 364/490 |
| 5,345,580 | 9/1994 | Tamaru et al. | 395/500 |
| 5,352,123 | 10/1994 | Sample et al. | 439/61 |
| 5,377,123 | 12/1994 | Hyman | 364/489 |
| 5,386,550 | 1/1995 | Yumioka et al. | 395/183.09 |
| 5,396,498 | 3/1995 | Lestrat et al. | 371/3 |
| 5,425,036 | 6/1995 | Liu et al. | 371/24 |
| 5,437,037 | 7/1995 | Furuuchi | 395/707 |
| 5,448,496 | 9/1995 | Butts et al. | 364/489 |
| 5,448,522 | 9/1995 | Huang | 364/189.04 |
| 5,452,231 | 9/1995 | Butts et al. | 364/489 |
| 5,452,239 | 9/1995 | Dai et al. | 364/578 |
| 5,475,624 | 12/1995 | West | 364/578 |
| 5,475,830 | 12/1995 | Chen et al. | 395/500 |
| 5,477,475 | 12/1995 | Sample et al. | 364/578 |
| 5,551,013 | 8/1996 | Beausoliel et al. | 395/500 |
| 5,572,710 | 11/1996 | Asano et al. | 395/500 |
| 5,596,742 | 1/1997 | Agarwal et al. | 395/500 |

| LOGIC PROC | LOGIC PROCESSOR I/O DEPENDENCIES | | | |
|---|---|---|---|---|
| | INPUT VALUE | EARLIEST TIME AVAILABLE (USED) | OUTPUT VALUE | LATEST TIME REQUIRED (GENERATED) |
| A | Q0 (STORED)<br>CLEAR<br>CLOCK_POSEDGE | 0<br>2<br>2 | Q0 | (NEXT PROGRAM CYCLE) |
| B | Q0 (STORED)<br>Q1 (STORED)<br>CLEAR<br>CLOCK_POSEDGE | 0<br>0<br>2<br>2 | Q1 | (NEXT PROGRAM CYCLE) |
| C | Q0 (STORED)<br>Q1 (STORED)<br>Q2 (STORED)<br>CLEAR<br>CLOCK_POSEDGE | 0<br>0<br>0<br>2<br>2 | Q2 | (NEXT PROGRAM CYCLE) |
| D | Q0 (STORED)<br>Q1 (STORED)<br>Q2 (STORED)<br>Q3 (STORED)<br>CLEAR<br>CLOCK_POSEDGE | 0<br>0<br>0<br>0<br>2<br>2 | Q3 | (NEXT PROGRAM CYCLE) |
| E | Q0 (STORED)<br>Q1 (STORED)<br>Q2 (STORED)<br>Q3 (STORED)<br>C0 INPUT<br>C1 INPUT<br>C2 INPUT<br>C3 INPUT<br>RESET (INPUT) | 0<br>0<br>0<br>0<br>1<br>1<br>1<br>1<br>1 | CLEAR | (BEFORE A,B,C AND D |
| F | CLOCK (INPUT) | 1 | CLOCK_DELAYED | (NEXT PROGRAM CYCLE) |
| G | CLOCK_DELAYED (STORED)<br>CLOCK | 0<br>1 | CLOCK_POSEDGE | (BEFORE A,B,C AND D |

*FIG. 12*

ASSIGNMENT OF LOGIC PROCESSORS TO EMULATOR RESOURCES

| OUTPUT VALUE | LOGIC PROC | TIME SLICE | LOGIC UNIT | LOGIC OUTPUT | LOGIC BUS WIRE |
|---|---|---|---|---|---|
| Q0 | A | 2 | 0 | 3 | 355 |
| Q1 | B | 2 | 0 | 2 | 354 |
| Q2 | C | 2 | 0 | 1 | 353 |
| Q3 | D | 2 | 0 | 0 | 352 |
| CLEAR | E | 1 | 0 | 0 | 352 |
| CLOCK_DELAYED | F | 1 | 0 | 2 | 354 |
| CLOCK_POSEDGE | G | 1 | 0 | 1 | 353 |

*FIG. 13*

ASSIGNMENT OF PRIMARY INPUTS TO LOGIC BUS LOCATIONS

| INPUT VALUE | TIME SLICE | LOGIC BUS WIRE |
|---|---|---|
| C0 | 0 | 352 |
| C1 | 0 | 353 |
| C2 | 0 | 354 |
| C3 | 0 | 355 |
| RESET | 0 | 356 |
| CLOCK | 0 | 357 |

*FIG. 14*

1K:1 MUX SETTINGS FOR TIME 1 LOGIC UNIT 0.

| INPUT INDEX | SELECT VALUE | SHIFT REGISTER INDEX | SHIFT REGISTER DELAY | TIME GENERATED |
|---|---|---|---|---|
| 0 | 508 | 7 | 4 | 1 |
| 1 | 511 | 23 | 1 | 0 |
| 2 | 381 | 37 | 3 | 2 |
| 3 | 253 | 51 | 3 | 2 |
| 4 | 509 | 71 | 3 | 2 |
| 5 | 381 | 85 | 3 | 2 |
| 6 | 639 | 105 | 1 | 0 |
| 7 | 383 | 117 | 1 | 0 |
| 8 | 511 | 135 | 1 | 0 |
| 9 | 255 | 147 | 1 | 0 |
| 10 | 63 | 160 | 1 | 0 |

*FIG. 17*

1K:1 MUX SETTINGS FOR TIME 2 LOGIC UNIT 0.

| INPUT INDEX | SELECT VALUE | SHIFT REGISTER INDEX | SHIFT REGISTER DELAY | TIME GENERATED |
|---|---|---|---|---|
| 0 | 447 | 6 | 1 | 1 |
| 1 | 191 | 18 | 1 | 1 |
| 2 | 380 | 37 | 4 | 2 |
| 3 | 252 | 51 | 4 | 2 |
| 4 | 508 | 71 | 4 | 2 |
| 5 | 380 | 85 | 4 | 2 |

*FIG. 18*

48:1 MUX SETTINGS FOR TIME 0

| MUX INDEX | SELECT VALUE | LOGIC BUS WIRE | LOGIC UNIT | LOGIC OUTPUT | INPUT VALUE |
|---|---|---|---|---|---|
| 23 | 44 | 357 | 1 | 1 | CLOCK |
| 105 | 44 | 356 | 1 | 0 | RESET |
| 117 | 44 | 355 | 0 | 3 | C3 |
| 135 | 44 | 354 | 0 | 2 | C2 |
| 147 | 44 | 353 | 0 | 1 | C1 |
| 160 | 44 | 352 | 0 | 0 | C0 |

*FIG. 19*

48:1 MUX SETTINGS FOR TIME 1

| MUX INDEX | SELECT VALUE | LOGIC BUS WIRE | LOGIC UNIT | LOGIC OUTPUT | INPUT VALUE |
|---|---|---|---|---|---|
| 6 | 44 | 353 | 0 | 1 | CLOCK_POSEDGE |
| 7 | 44 | 354 | 0 | 2 | CLOCK_DELAYED |
| 18 | 44 | 352 | 0 | 0 | CLEAR |

*FIG. 20*

48:1 MUX SETTINGS FOR TIME 2

| MUX INDEX | SELECT VALUE | LOGIC BUS WIRE | LOGIC UNIT | LOGIC OUTPUT | INPUT VALUE |
|---|---|---|---|---|---|
| 37 | 44 | 352 | 0 | 0 | Q3 |
| 51 | 44 | 353 | 0 | 1 | Q2 |
| 71 | 44 | 354 | 0 | 2 | Q1 |
| 85 | 44 | 355 | 0 | 3 | Q0 |

*FIG. 21*

EMULATION SYSTEM HAVING MULTIPLE EMULATED CLOCK CYCLES PER EMULATOR CLOCK CYCLE AND IMPROVED SIGNAL ROUTING

NOTICE REGARDING COPYRIGHTED MATERIAL

A portion of the disclosure of this patent document contains material which is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND OF THE INVENTION

This invention relates generally to digital emulation systems and specifically to a digital emulation system using multiple logic processors with improved signal routing.

As electronic circuit designs continue to increase in speed and complexity, it becomes ever more critical to test the developing circuit designs at various stages of development. Hardware emulators provide a means to test complex circuit designs as the designs are being developed. Such emulators typically provide configurable hardware that is controlled by software to perform the functions of a circuit being designed. The circuit design is specified by a set of data which defines the circuit structure and behavior.

Emulators operate under software control. The circuit design is "compiled" to produce the program that controls the emulator. The process of compiling the design to produce the program for the emulator is a critical and lengthy process. A lengthy compile time is due, in part, to the goal of producing a program that emulates the circuit design as fast as possible. Speed is of the essence in emulators because inevitably the emulator cannot perform the functions of the circuit being emulated as quickly as the actual circuit, itself. It is desirable to operate the emulator at speeds as close as possible to the target operating speed of the emulated circuit for purposes of accurately interfacing the design to external circuits or other devices and to test the circuit for timing problems.

Another reason why the compilation step is complex and time consuming is that constraints in the hardware of the emulator make it difficult to optimize the program for speed without making many computations during compilation. Since an emulator must perform the functionality of a wide range of circuit designs [ ] it should be as flexible as possible. This means the emulation system must contain logic processing hardware that is reusable for different designs. Such an emulation system would contain a large number of general purpose processing elements that are used to indirectly perform the function of the circuit being emulated. For example, a general purpose emulator would process multiple boolean logic equations to emulate a multiplier circuit rather than use a dedicated hardware multiplier for the same purpose which would then become unusable in the emulation of circuit designs which do not contain any multiplier functions. In order to solve these equations, many gates, or other devices, in the emulator must be provided with signals. Further, the outputs of the gates or other components must be routed efficiently among the various components of the emulator.

Even though the compilation step is complicated and lengthy, it is necessary to make this step as brief as possible so that a human designer does not have to wait a long time before emulating the latest design change. This is especially important where emulators are used in the design and development of integrated circuits. Many incremental changes are made, each of which requires a compilation step before emulation can proceed. This implies that the time of the compilation step should be shortened in order to increase the utility of the emulator.

Therefore, it is desirable to produce an emulator that provides for short compilation times and that produces an emulation program capable of emulating a circuit design at a high speed.

SUMMARY OF THE INVENTION

The present invention uses an improved routing and processing architecture to allow signals to be exchanged between multiple processors within an integrated circuit or between integrated circuits. The use of selectors coupled to shift registers that, in turn, feed additional selectors that output to logic units, or logic processors, provides a flexible architecture while also providing a uniform programming model that results in fast compile times.

In a preferred embodiment, an emulation system for emulating a circuit design is fabricated on a chip and includes first selectors coupled to a plurality of input signals. Some of the input signals to the first selectors include outputs from the logic processors on the same chip as the first selectors while other input signals are from logic processors in other integrated circuits. Shift registers, or "pipes," are provided whose inputs are the outputs of the first selectors. The shift registers provide for storing the signals from the first selectors in accordance with the program steps of a program that is used to control the emulation system.

Second selectors coupled to the outputs of the pipes are used to further select the signals to be applied to an individual logic processor. The outputs of the second selectors are fed to the inputs of the logic processors. This arrangement of selectors, shift registers and logic processors provides a uniform routing scheme with resulting advantages in both speed of compilation before the emulation phase and speed of execution during the emulation phase.

BRIEF DESCRIPTION OF THE DRAWINGS

FIG. 12 shows assignments of logic functions to logic processors;

FIG. 13 shows assignments of logic processors to timeslices and bus wires;

FIG. 14 shows the assignment of inputs to bus wires;

FIG. 17 shows the mux settings for the 1K:1 selectors in timeslice 1;

FIG. 18 shows the mux settings for the 1K:1 selectors in timeslice 2;

FIG. 19 shows the settings for the 48:1 multiplexers in timeslice 0;

FIG. 20 shows the settings for the 48:1 multiplexers in timeslice 1; and

FIG. 21 shows the settings for the 48:1 multiplexers in timeslice 2.

DESCRIPTION OF THE PREFERRED EMBODIMENT

Figure 1:
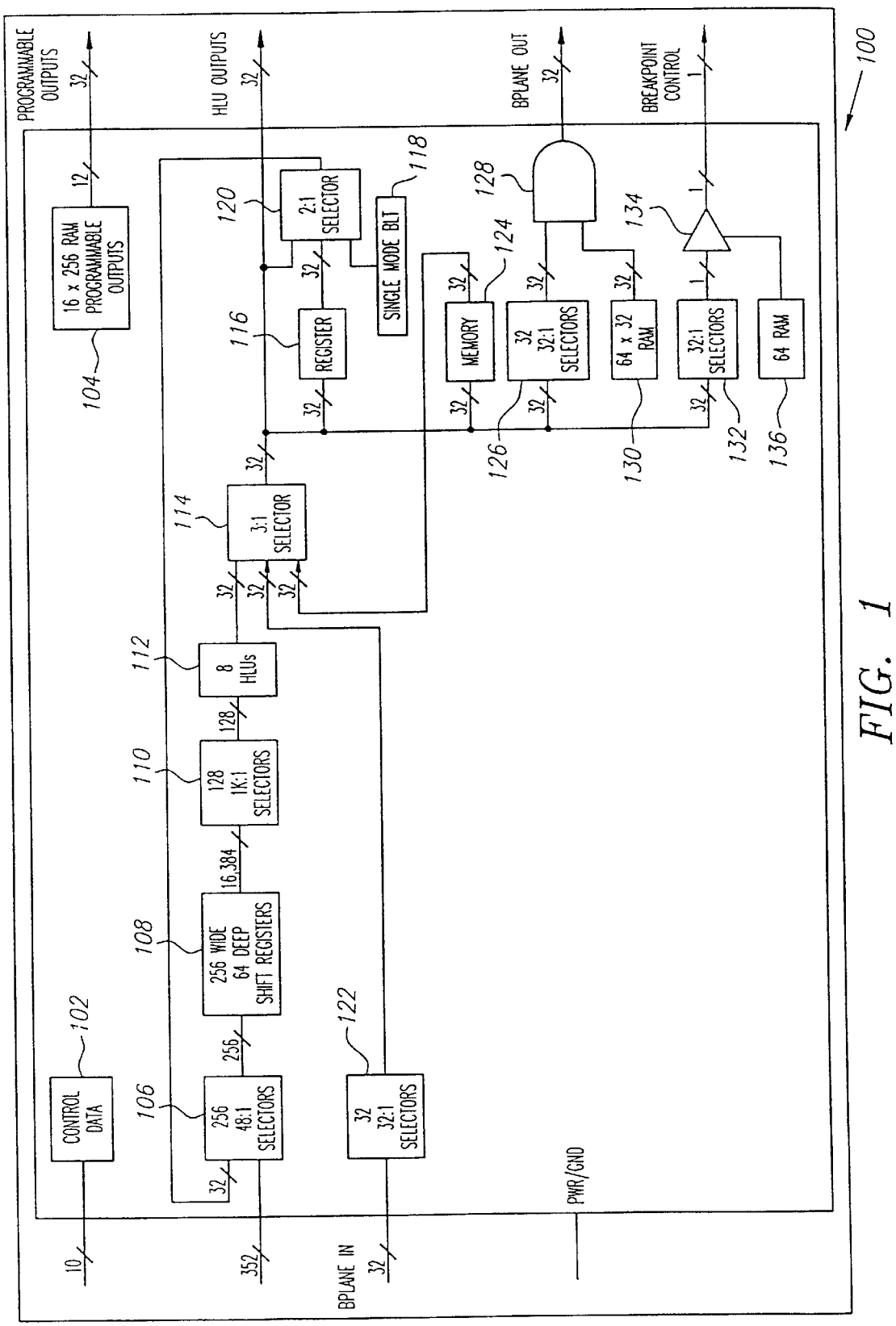
FIG. 1 is a system level block diagram of a single integrated circuit in the emulator of the present invention.

FIG. 1 is a system level block diagram of a single "chip" in a preferred embodiment of the emulator of the present invention. The preferred embodiment discussed herein is intended to be produced as a commercial product known during development as the Hydra Logic Emulation System and referred to here as the "logic emulation system," developed by Arkos Design, Inc. The design shown at the system level as chip 100 in FIG. 1 is fabricated on a single integrated circuit (IC) package referred to as the Hydra Chip. Additional FIGS. 2–7 show board-level and block-level details of the logic emulator system. Although a specific embodiment of an emulator is discussed for illustrative purposes, the scope of the invention is not limited to this specific embodiment.

In FIG. 1, chip 100 includes various subcircuits for performing specific functions. The subcircuits are shown as blocks in FIG. 1, such as control data 102. In discussing the emulation system the architecture of the logic emulation system is presented in the section immediately below. Next, a detailed discussion of selected subcircuits in the logic emulation system is presented with a focus on subcircuits 106–112 which concern the selector and shift register routing of data to the Hydra logic units ("HLUs") that give the logic emulation system a special advantage in its ability to universally and uniformly route variable data among the HLUs. In a subsequent text section an example of compiling a circuit for execution in the emulation system is provided.

I. Logic Emulation System Architecture

In FIG. 1, control data 102 is used to store the microcode control words that direct the operation of the Hydra Chip ("chip"). In the preferred embodiment, control data 102 provides for 64 control words, each of approximately 10,000 bits in width. Various numbers of bits in each control word are routed, by means of control lines, to other functional blocks on the chip to control, e.g., n:1 selectors, shift registers, pass gates, signal inversion, as discussed below. For ease of illustration the control lines are omitted from FIG. 1. However, it will be apparent that the control words may be used in manners well-known in the art to control the various devices and functional blocks.

Control data 102 is loaded with up to 64 control words of the control program generated by a compiler. The compiler is software that receives, as input, a specification of a circuit to be emulated and outputs a control program in the form of equations and control logic to cause the chip to emulate the desired circuit. The words of the control program are executed each emulation cycle, where an emulation cycle is one cycle of the emulated circuit. That is, if a circuit being emulated runs at 1 MHz the emulation cycle is 1.0 uS. This means that all of the steps in the program must complete within 1.0 uS. Since there are a maximum of 64 program steps allowed, the emulator clock would run at 64 MHz maximum. If there are less than 64 program steps, the emulator clock speed can be slowed down accordingly. A detailed description of the approach of using multiple emulator clock cycles per emulated clock cycle, and the advantages of doing so, may be found in related copending patent application Ser. No. 08/242,164.

The emulator includes the ability to lengthen any of the program steps by up to three additional emulator clock cycles. This is useful for interfacing the emulator to target hardware requiring longer access times. When program steps are lengthened this naturally extends the overall program cycle accordingly.

Programmable outputs RAM 104 is a 16×256 bit random access memory (RAM) to provide the chip with a way to send predefined output values to external circuitry. As shown in FIG. 1, 12 bits exit from the chip to the outside world for use in interfacing to external circuits. The other four bits of each word are "internal use" bits used to control chip functions. Programmable outputs RAM 104 allows the compiler to define "canned" output values for output at specified times within an emulated clock cycle. There are 256 addresses that are sequenced in order according to the emulator clock. There are four times as many word locations in RAM 104 as there are control data word locations in control data 102 because the chip allows for control data cycles to be extended by up to three additional cycles. Thus, each of the 64 control words can be maintained on the output lines of control data 102 for up to four cycles. Meanwhile, the address locations of RAM 104 are still incremented. This allows values from RAM 104 to be output within a control word cycle when the control word is being extended. The rate at which RAM 104 is sequenced, using the present example, is 64 MHz.

Functional blocks 106–112 form the heart of the routing and processing ability of the chip. These blocks are discussed in detail, below. Essentially, blocks 106–110 provide multiplexing and shift register/storing ability for variable values that are fed to HLUs 112 for processing.

Functional block 112 includes 8 logic units, each consisting of four Hydra Logic Processors ("processor") with four outputs, for a total of 32 outputs. These outputs from the 8 internal logic units are included as inputs to 3:1 Selector 114. 3:1 Selector 114's other inputs include signals from the backplane (designated as BPlane In) via 32:1 Selectors 112. This allows any of the 32 backplane signals to be routed to any of the inputs of 3:1 selector 114. The backplane signals are inter-board signals. The board-level design of the logic emulation system is discussed below in connection with FIG. 7. The third set of inputs to 3:1 Selector 114 is from Memory 124. Memory 124 is connected to the output of 3:1 selector 114 to allow the emulation system to emulate a RAM, or multiple RAMs, in the user's circuit design. The outputs of 3:1 Selector 114 are provided to 2:1 Selector 120 and to pin pads in the chip. 2:1 Selector 120 acts to return the signals back to the inputs of the HLUs via the routing arrangement of blocks 106–110. Thus, 3:1 Selector 114 allows the system to select from among three separate signal sources to output to processors both within, and external to, the chip on which the processor function of the emulation system of the present invention is fabricated.

In the preferred embodiment, Memory 124 is a 4K×32 bit RAM. The RAM is addressed from signals generated by the HLUs local to the chip, and external to the chip, via the backplane. One or more bits of the address may be obtained, and stored for use each emulator cycle. The address is built and latched piecemeal over one or more cycles so that the system has wide flexibility in emulating the address logic in the circuit design being emulated. The structures for latching and applying the address are not shown in FIG. 1. Data values for the RAM are obtained from the outputs of the HLUs, from the backplane, or from the RAM, itself.

Register 116 provides for storing the output values from the HLUs so that they may be delayed by one emulator cycle or more. Whether the current variable values, or the stored variable values from register 116, are output is determined by single mode bit 118 attached to the control line of 2:1 selector 120. Single mode bit 118 is obtained from one of the four "internal use" bits of RAM 104 discussed above, thus it is changeable each emulator clock cycle.

32:1 selectors 126, AND gates 128 and RAM 130 allow signals from the HLUs to be selectively output onto the backplane for use by processors on other boards. The signals are placed onto the backplane bus by using open-collector drivers so that the signals from each chip are effectively "wire ORed" onto the backplane. RAM 130 is loaded by the compiler and is used to enable specific signals onto the backplane each emulated clock cycle since one of each of the used control words in RAM 130 is addressed consecutively once each emulated clock cycle.

32:1 selectors 132 are used along with drivers 134 and RAM 136 to output breakpoint control signals. RAM 136 functions similarly to RAM 130 in that it is loaded by the compiler as part of the emulator program and its address is incremented once each emulator clock cycle. Breakpoints are implemented by having the HLUs evaluate equations to check for signal (i.e., variable) states and, upon detecting the desired combination, outputting a high signal that is selected by 32:1 selector 132. 32:1 selector 132 is controlled, as are the other selectors of FIG. 1 except for selector 120, by control signals from control data 102.

The routing and processing of blocks 106–112 will next be discussed in detail.

A. Routing

Functional blocks 106–112 are the core of Hydra Chip 100's routing and processing. Since the chip relies on multiple emulator cycles per emulated cycle it is crucial that data can be quickly and easily routed between the various local and remote (i.e., on-chip and off-chip) processors so that several iterations of processing data with the same logic units (discussed below) can be efficiently achieved.

In FIG. 1, 256 48:1 selectors are used to choose from among 32 internal signal lines and 352 external signal lines. The 32 internal signal lines are fed back from the outputs of the 8 HLUs 112 while the external signal lines are from 11 external processors, each identical to the diagram of FIG. 1, to provide 11×32=352 signals. Thus, the total number of signals entering the 256 48:1 selectors 106 is 352+32=384. Each of the 384 signals is distributed to 32 inputs in the 256 48:1 selectors. Thus, the total number of inputs in the 48:1 selector group is 32×384=12,288.

The 48:1 selectors output 256 signals to 256 shift registers 108. The routing is one-to-one with each 48:1 selector output feeding a single 64 stage, or 64 bit, shift register input. The combination of 48:1 selector and shift register is referred to as a "pipe." Each stage of each shift register is output so that the number of outputs from the shift register group is 64×256=16,384 outputs. The 16,384 outputs are provided to the 128 1K:1 selectors.

The outputs of the 1K:1 selectors are sent to 8 HLUs 112. Each HLU receives the outputs from 16 1K:1 selectors.

Figure 2:
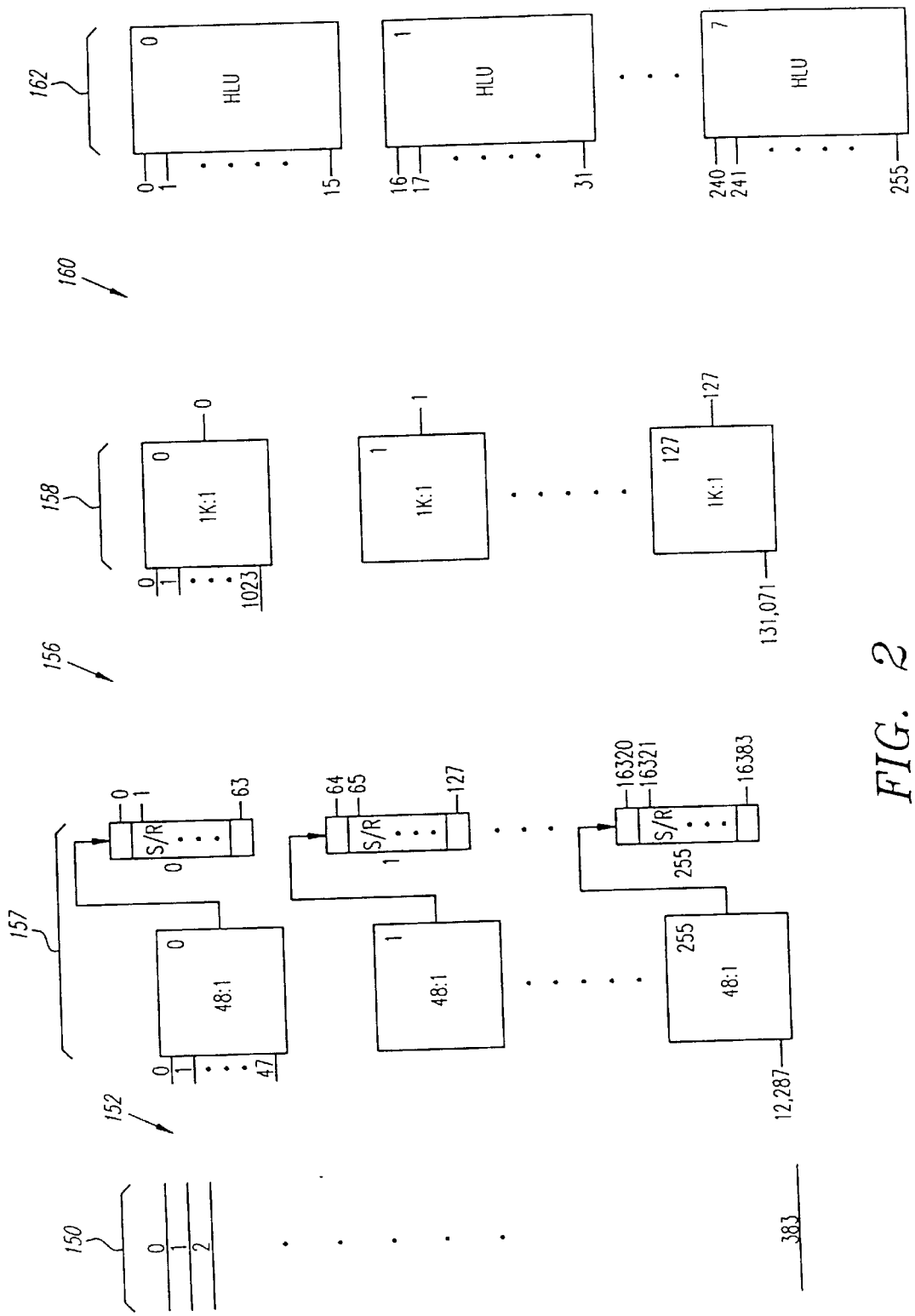
FIG. 2 shows an expanded diagram of the routing of some functional blocks in FIG. 1.

FIG. 2 shows an expanded diagram of the routing of blocks 106–112. In FIG. 2, 384 signals at 150 are provided to pipes at 154. The interconnections between the 384 signals and the pipes is at 152. A preferred interconnection scheme distributes each of the 384 signals to 32 different inputs of the 48:1 selectors. The preferred interconnection allows for routing each signal to 16 pairs of 64 bit shift registers. The pairs are separated so that the input signal fanouts have the smallest overlap possible. The exact connections are shown in Appendix A under the headings "//input fanouts" and "Pipe fanins . . . " for signal-to-pipe connections and pipe-to-signal connections, respectively.

Connections between pipes at 154 and selectors at 158 are such that consecutive groups of 8 1K:1 selectors receive the same 1024 outputs from a group of 16 shift registers. For example, in the first group of 8 1K:1 selectors (selectors 0–7), each selector receives the same 1024 outputs from shift registers 0–15. In the next group of 8 1K:1 selectors (selectors 8–15), each selector receives the same 1024 outputs from the next 16 shift registers (shift register numbers 16–31) and so on.

Connections at 160 between 1K:1 selectors at 158 and HLUs at 162 are assigned by taking sixteen of the 1K:1 selectors modulo 16. For example, HLU 0 is connected to 1K:1 selectors 0, 16, 32, 48, . . . , 112. HLU 1 is connected to 1K:1 selectors 1, 17, 33, 49, . . . , 113.

Figure 3A:
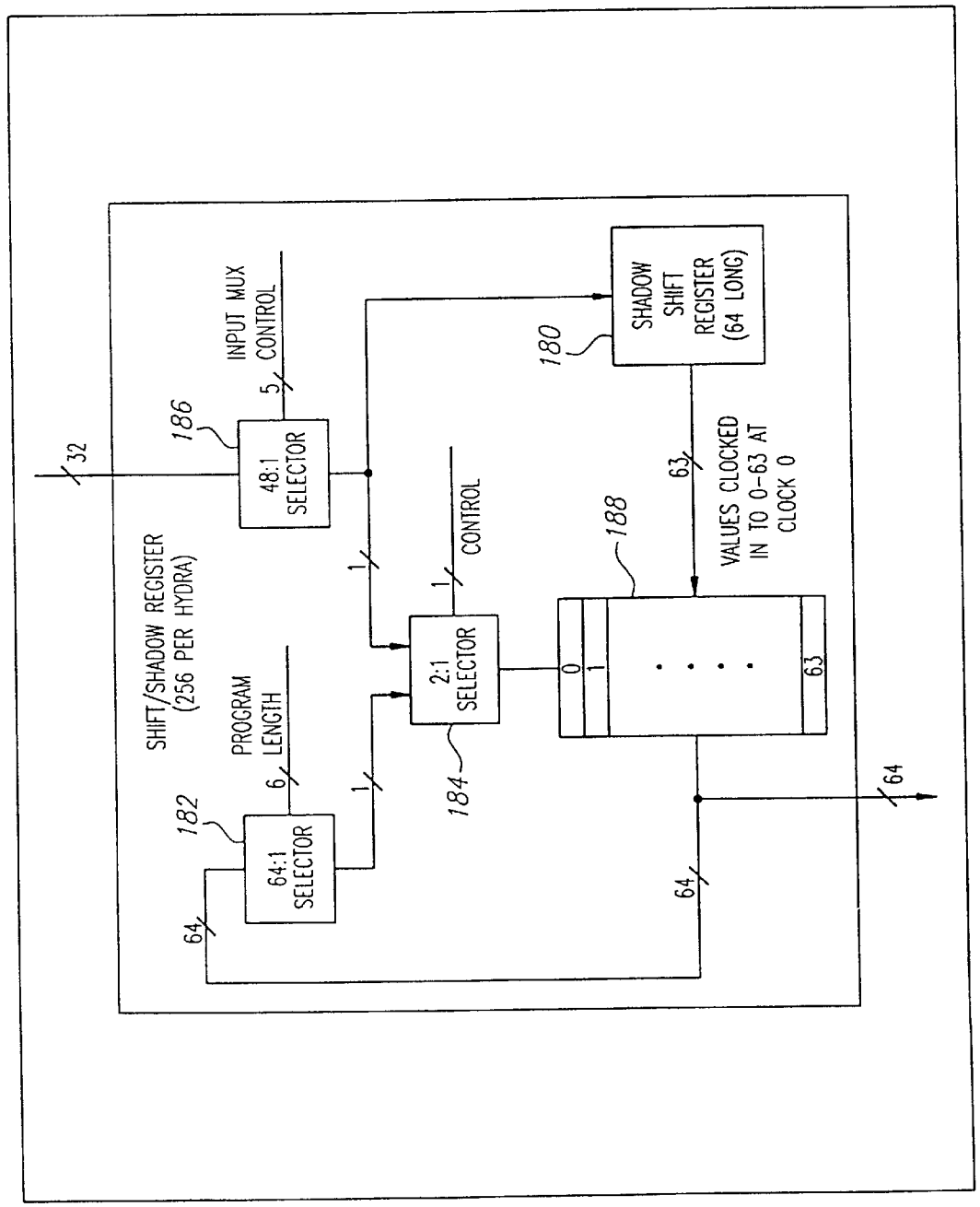
FIG. 3 shows more details of the circuitry of first functional blocks in FIG. 1.

FIG. 3 shows more details of the circuitry of functional blocks 106 and 108 of FIG. 1. Specifically, FIG. 3 shows the inclusion of a "shadow" shift register 180, 64:1 selector 182 and 2:1 selector 184. 48:1 selector 186 and shift register 188 are the same components discussed above and shown in FIG. 1 as 106 and 108, respectively.

The use of shadow shift register 180 provides distinct advantages in the ability of the emulation system of the present invention to handle logic elements such as flip-flops where the state of the logic element which was computed during the current emulated clock cycle is not required as an input to other logic elements until the next emulated clock cycle. Shift register 188 is used to store results of computations in each of the 64 (maximum) steps in the emulation program. However, a special case occurs where, for example, a flip flop output, or any other "registered" signal, is not required until the next cycle. These registered signals must not be updated for use until the end of the current emulated clock cycle. Thus, the shadow register is used to store the values of these types of registered variables from the time they were generated until the time they are required as inputs to logic functions. At the end of the program cycle, i.e., after all program steps have been executed for the current cycle, the values from shadow shift register 180 are copied into shift register 188 so that the new values for these registered variables are available for use as inputs to the next program cycle. The copying is performed by loading shift register 188 with the parallel outputs of shadow shift register 180. This allows for time-independent routing of all "registered" signals through the emulator since the signals are not required until the following program cycle.

As can be seen from FIG. 3, values from 48:1 selector 186 are routed both to shadow shift register 180 and, selectively, to shift register 188 via 2:1 selector 184. Where the value from 48:1 selector 186 is a registered variable, the registered variable is copied to shadow shift register 180, only, and not to shift register 188. Instead, shift register 188 receives a value from 64:1 selector 182 which is generated during the previous program cycle so that any registered variables that change during the current program cycle are not updated until the next program cycle.

64:1 selector 182 allows values from anywhere within shift register 188 to be routed back to stage 0 of the shift register. This allows flexible access to variable values that are computed within a program cycle. The selection of variable through 64:1 selector 182 is by the six control lines shown connected to 64:1 selector 182 and which are controlled from the control data. Other control signals such as the five input multiplexer (MUX) lines to 48:1 selector 186 and single control line to 2:1 selector 184 also issue from the control data.

B. Processing

Figures 4, 4A:
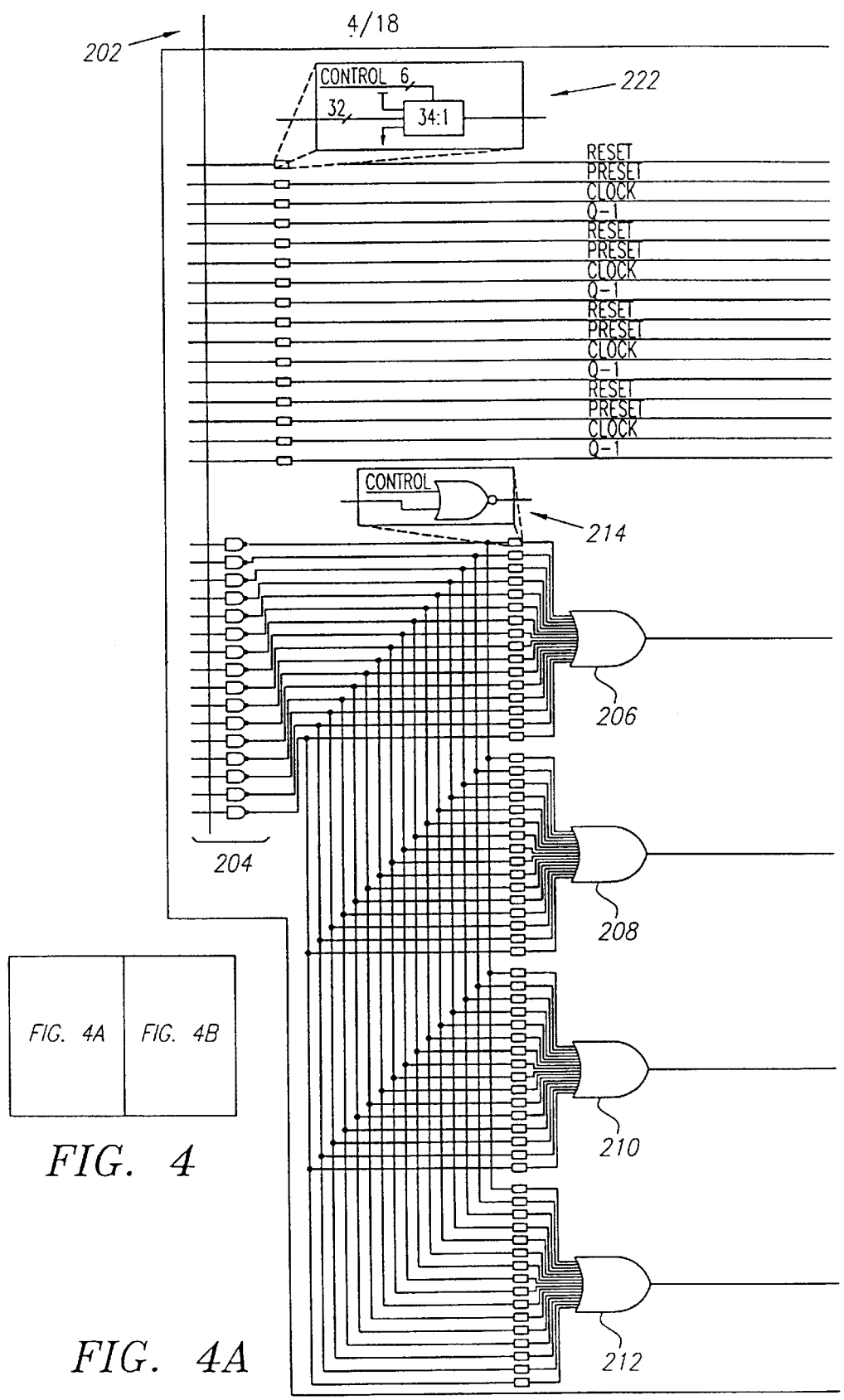
FIG. 4 shows an expanded diagram of the logic in the logic unit block of FIG. 1.
Figure 4B:
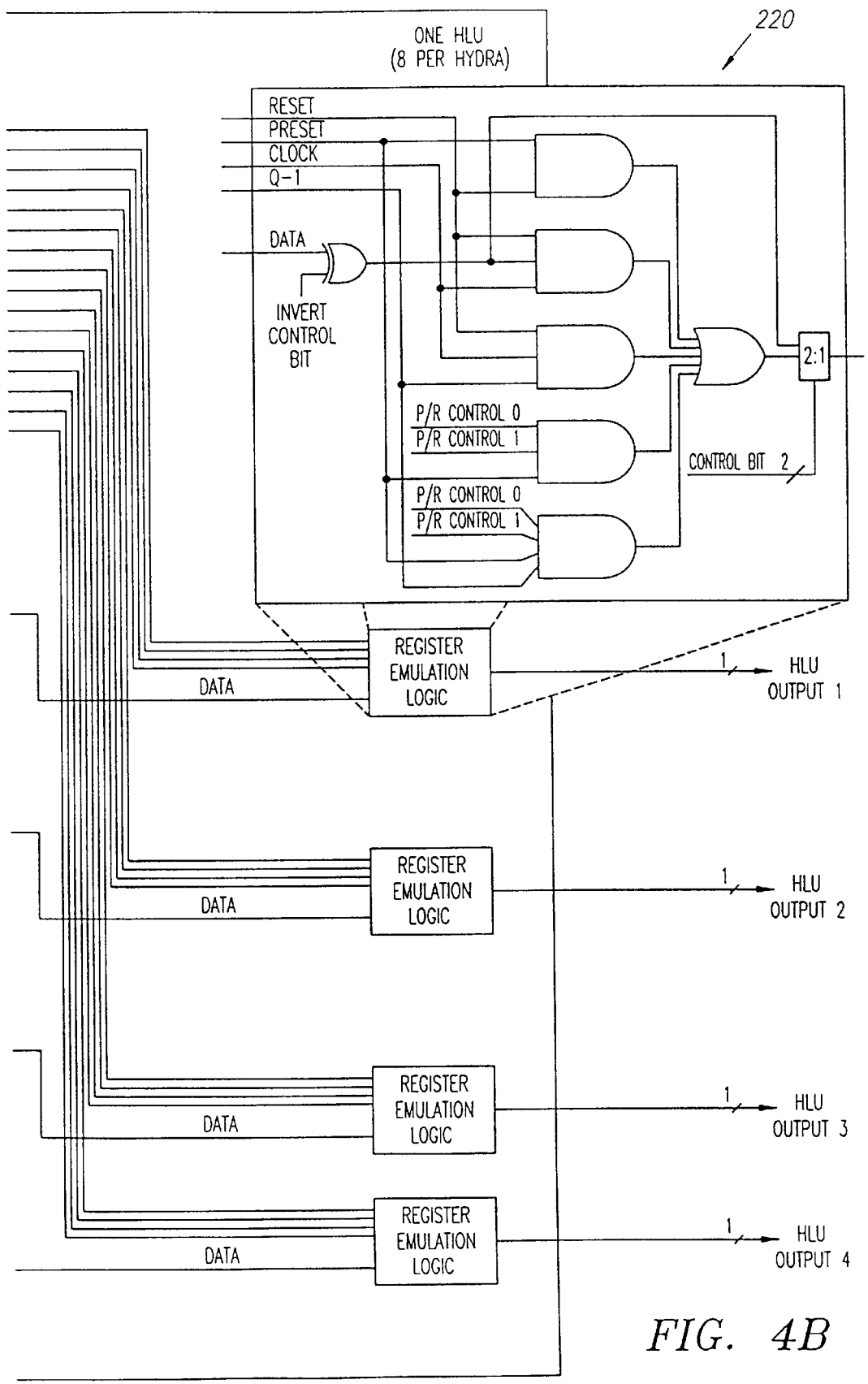
Figure 5:
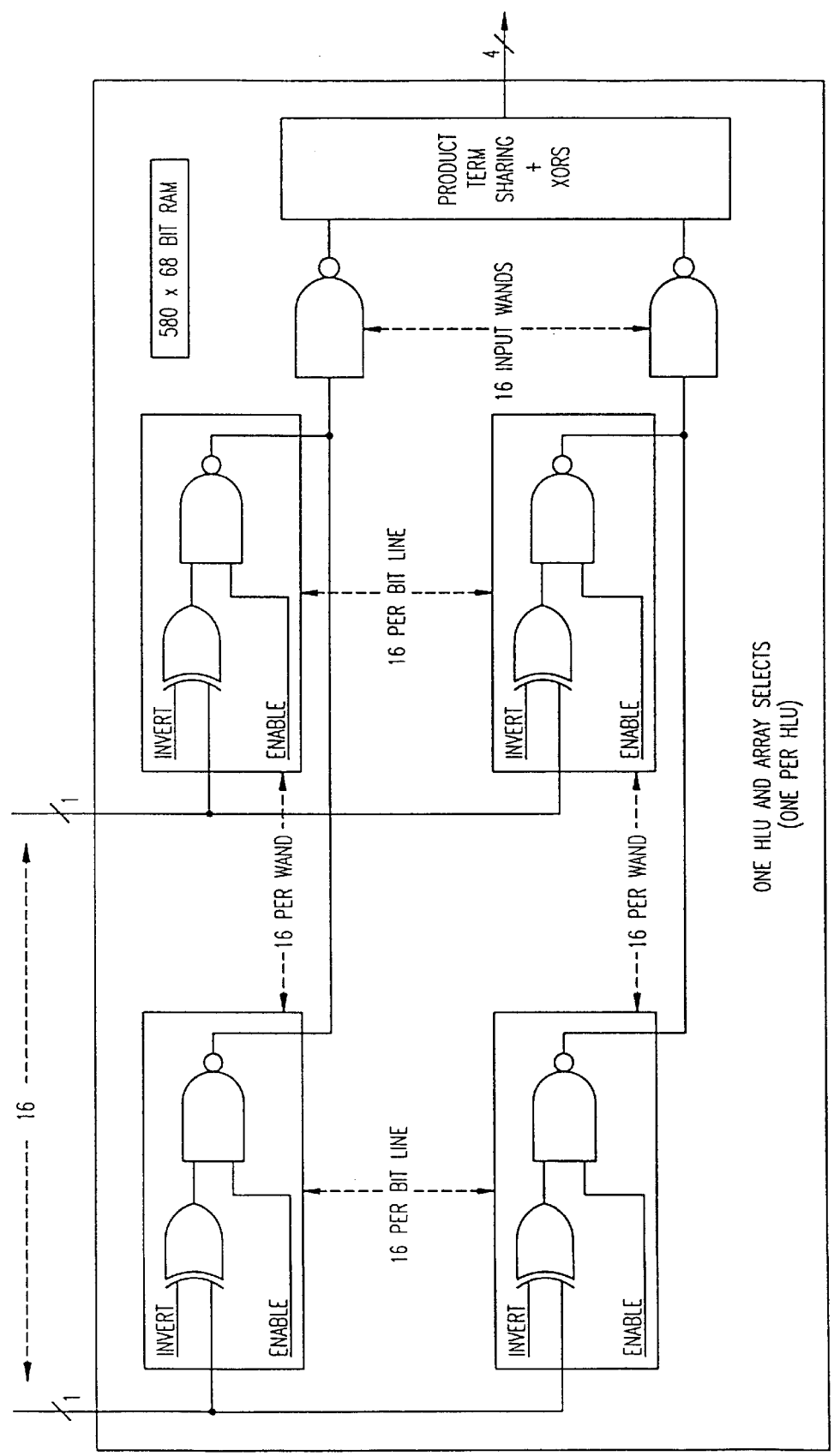
FIG. 5 shows more detail relating to the input wand circuitry of FIG. 4.

Next, FIGS. 4 and 5 are discussed to illustrate details of the Hydra logic units used for processing in the emulation system of the present invention.

FIG. 4 shows an expanded diagram of the logic in block 112 of FIG. 1. In FIG. 4, one of 8 HLUs on the chip is shown. Sixteen inputs from 16 of the 1K:1 selectors enter the HLU at 202. The inverted signals are also provided so that a total of 32 signals is represented by the dark shaded line. The 16 signals are coupled through inverters and pass gates, also called input "wands," shown in larger scale and more detail in FIG. 5, to the OR gates 206–212. Each of the 16 signals can be passed through each of the input wands so that any of the signals can be applied to any of the inputs of the OR gates 206–212. Note that each of the lines to the OR gates is provided with a NOR gate such as NOR gate 214 so that each input to the NOR gates can be selectively disabled with the application of a zero, or low, signal.

OR gates 206–212 are used to compute sum-of-products terms to solve boolean equations that emulate the functions of the user's circuit design. The compiler converts the user circuit design into boolean equations which are then converted into multiple program steps. The program steps are loaded into the emulation architecture in the form of microcode words in control data 102 of FIG. 1 and control signals in various select RAM throughout the system. In this respect, the system of the present application is similar to the system of copending patent application Ser. No. 08/242,164.

Returning to FIG. 4, register emulation logic 220 is provided at the output of each of the OR gates. Register emulation logic 220 provides specialized control signals to allow the emulator to handle sequential element emulation, such as registers and latches, in an efficient manner. Signals such as "Reset," "Preset," "Clock" and "Q-1" represent signals of their well-known counterparts in standard sequential devices. These signals are obtained from the 16 input signals and their inverted signals by using 34:1 selectors as shown, for example, at 222. Note that the 34:1 selectors allow a high or low signal to be selected in addition to the 16 input signals and their inversions. Signal "Q-1" is normally the previous value of what was stored in a register being emulated.

The invert control bit of register emulation logic 220 allows inversion of the data signal according to control data. The P/R control signals determine whether a preset or reset will be controlling when both a preset and reset occur at the same time. The P/R control lines are coupled to control RAM, as are the two control bits to the 2:1 selector of register emulation logic 220. The 2:1 selector provides for a bypass of the register emulation logic when it is not needed.

Figure 6:
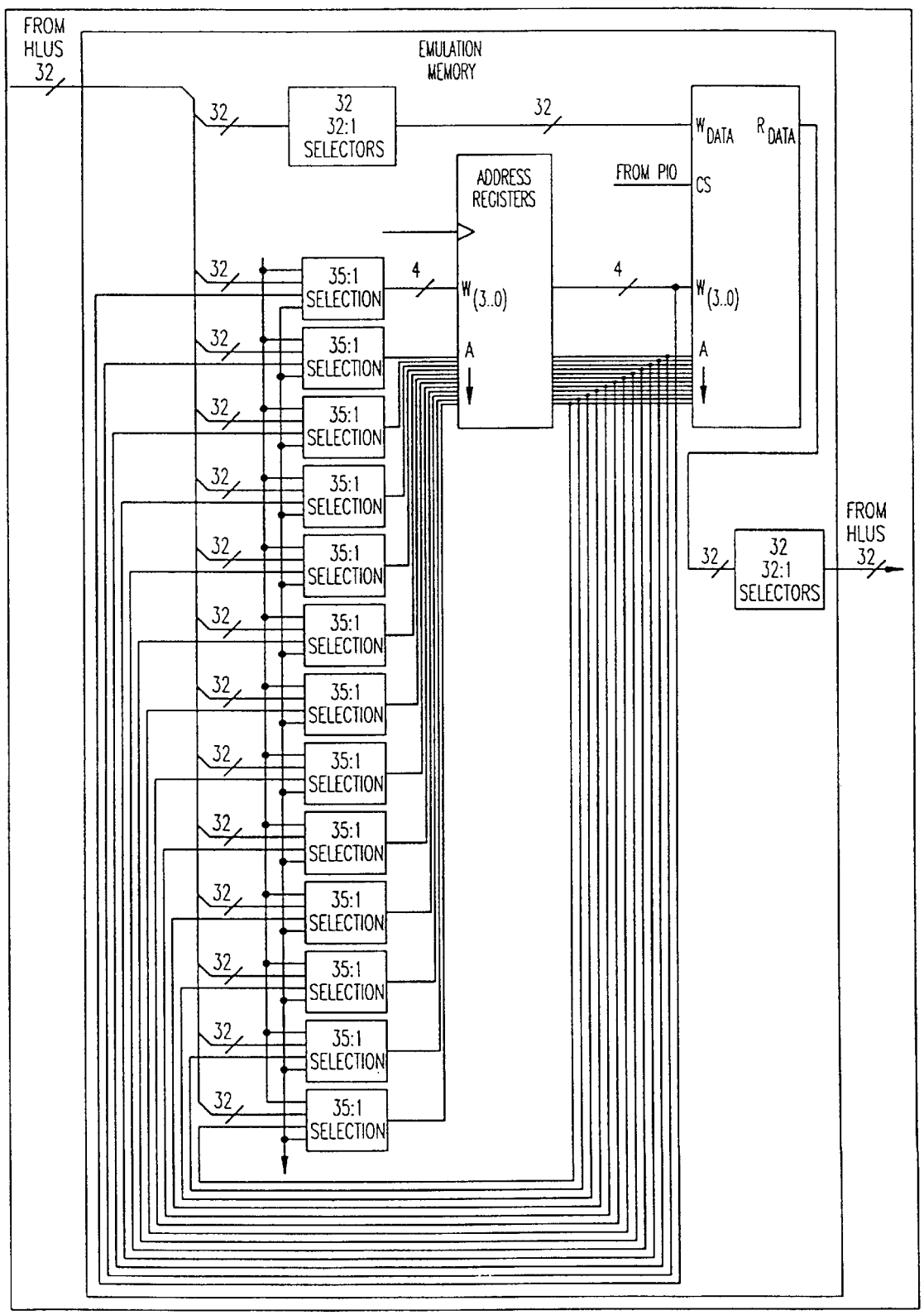
FIG. 6 shows more detail in the emulation memory block of FIG. 1.

FIG. 6 shows more detail in functional block 124, the emulation memory, of FIG. 1. The emulation memory circuitry provides an efficient way for the values generated from the HLUs to be stored and used in addressing the emulation memory.

Figure 7:
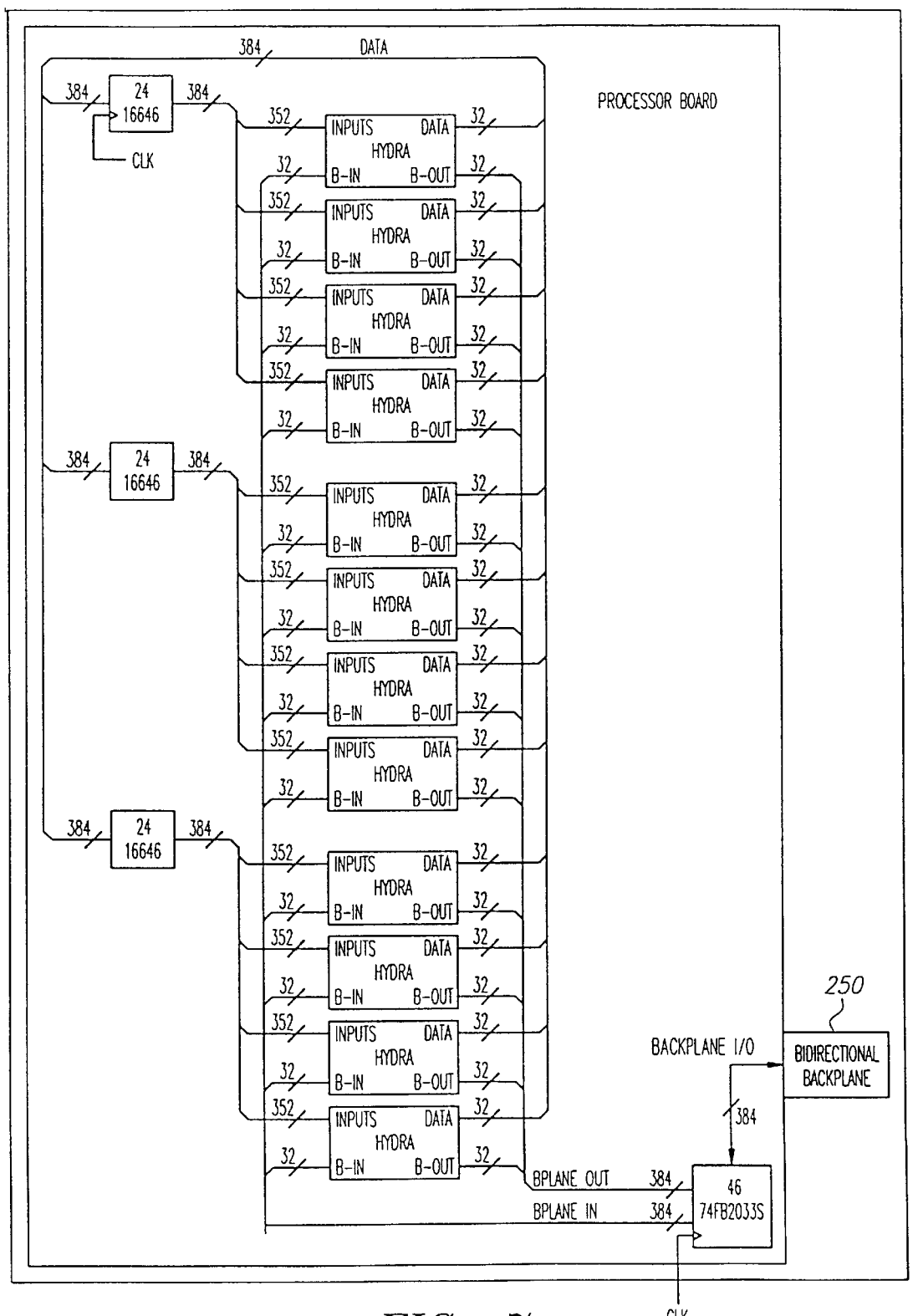
FIG. 7 shows a board level configuration of 12 logic unit chips of the present invention.

FIG. 7 shows a board level configuration of 12 Hydra chips. FIG. 7 includes backplane 250 that can accommodate additional similar boards. Devices [16646] are register transceivers while devices [74FB2033] are backplane interface transceivers.

II. Logic Emulation System Compiler Operation

Figure 8A:
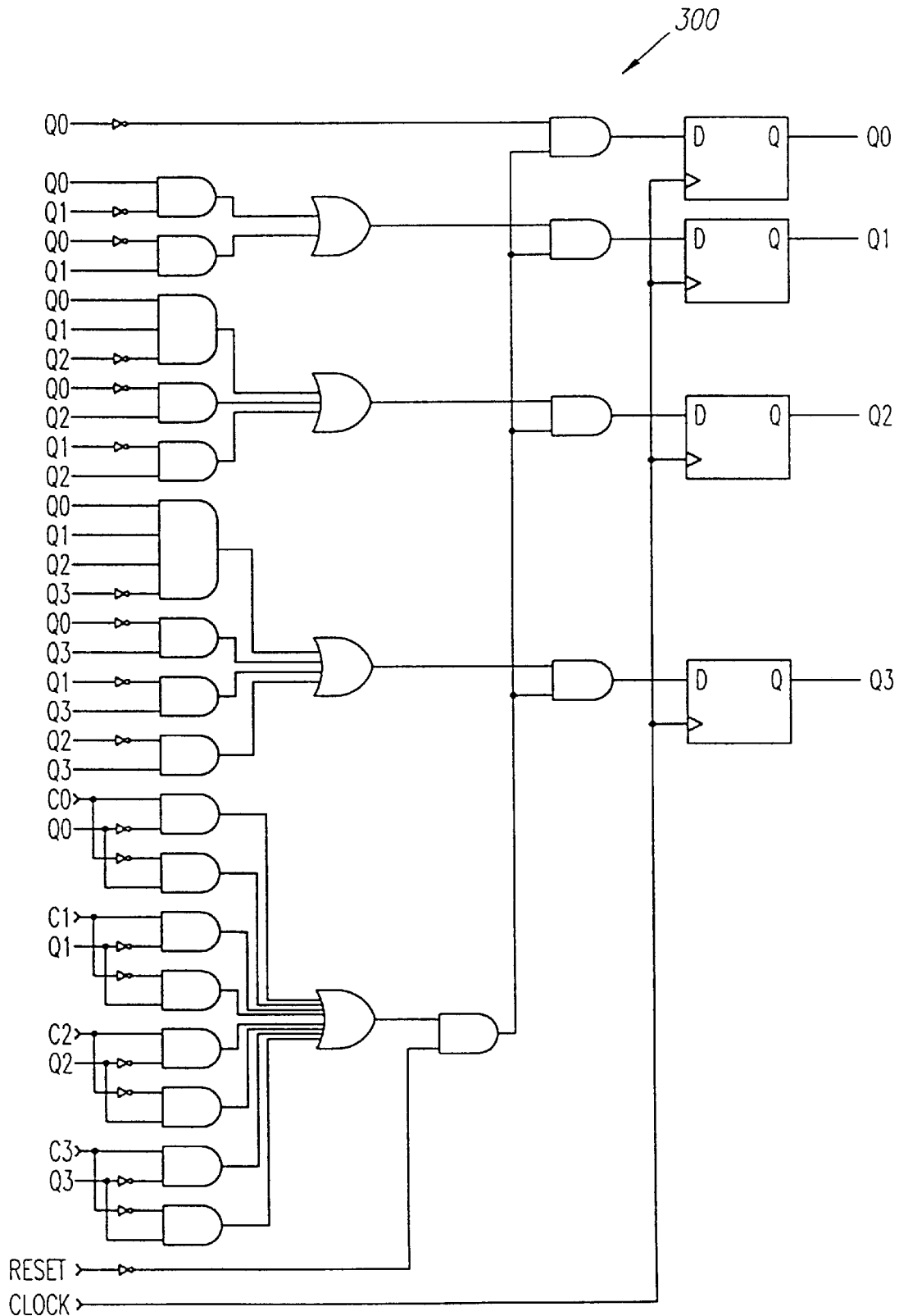
FIG. 8A shows an example of a circuit to be emulated.

FIG. 8A shows a circuit 300 as an example of a circuit that a user wishes to emulate. Circuit 300 is a 4-bit binary counter with outputs Q0–3, termination count inputs C0–3, RESET and CLOCK signals. Termination count inputs C0–3 are used to specify when the counter resets. When the count on Q0–3 matches the value specified on C0–3 the counter resets to 0 and resumes counting up.

Figure 8B:
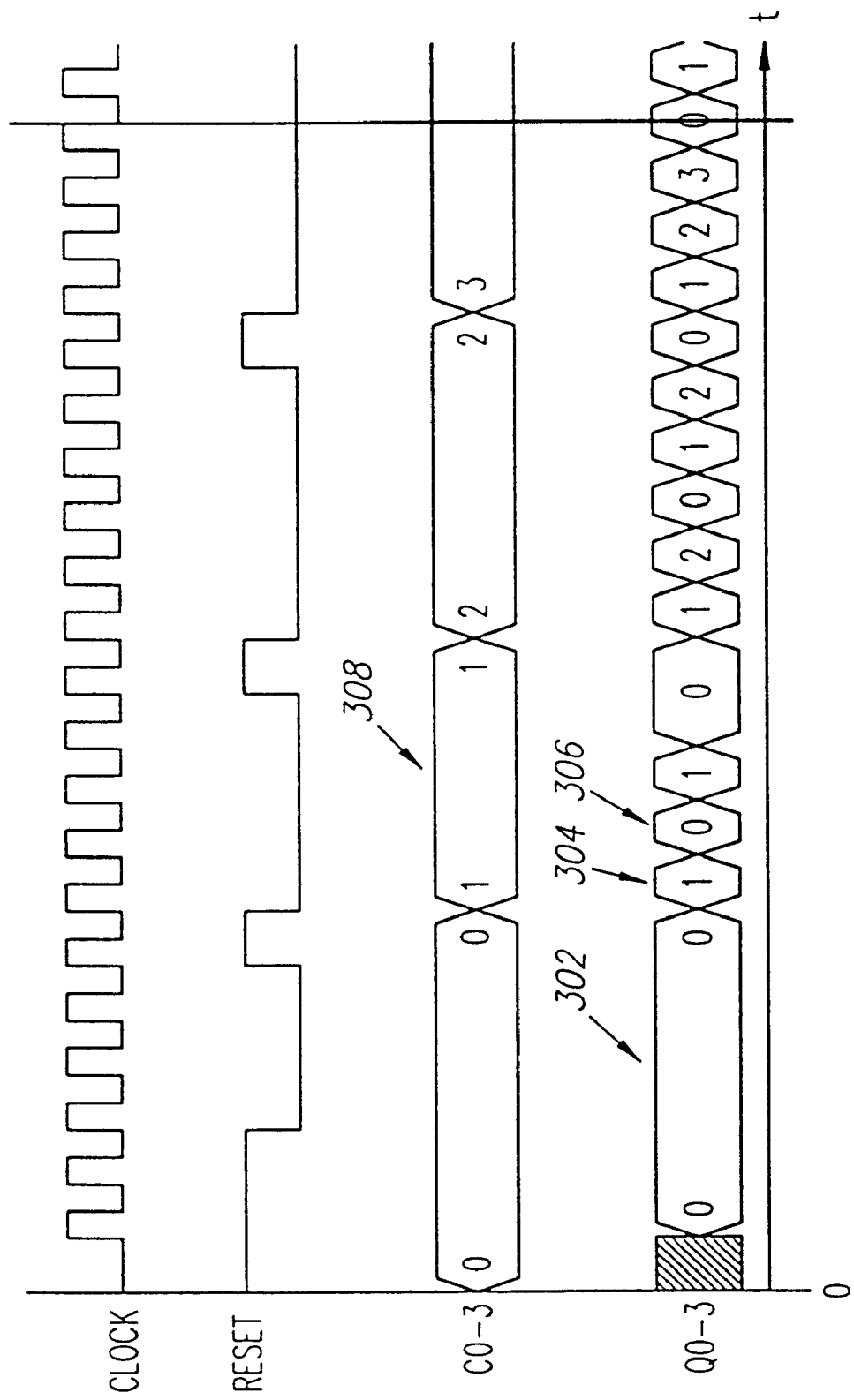
FIG. 8B shows the timing diagram for the circuit of FIG. 8A.

FIG. 8B shows the timing diagram for the circuit of FIG. 8A. In FIG. 8B, outputs Q0–3 are shown to output different values (0, 1, 2 and 3) at different points in time according to the other signals CLOCK, RESET and terminal count bits C0–3. For example, at 302 outputs Q0–3 output the value 0. At 304, outputs Q0–3 output the value 1. At 306, outputs Q0–3 are reset to the value 0 since terminal count bits C0–3 specify a terminal count of 1 at 308. Similarly, Q0–3 are shown incrementing up to the terminal count currently specified for subsequent portions of the timing diagram. Note that the count changes on the leading edge of CLOCK and that whenever RESET is high the count becomes 0.

Figure 9:
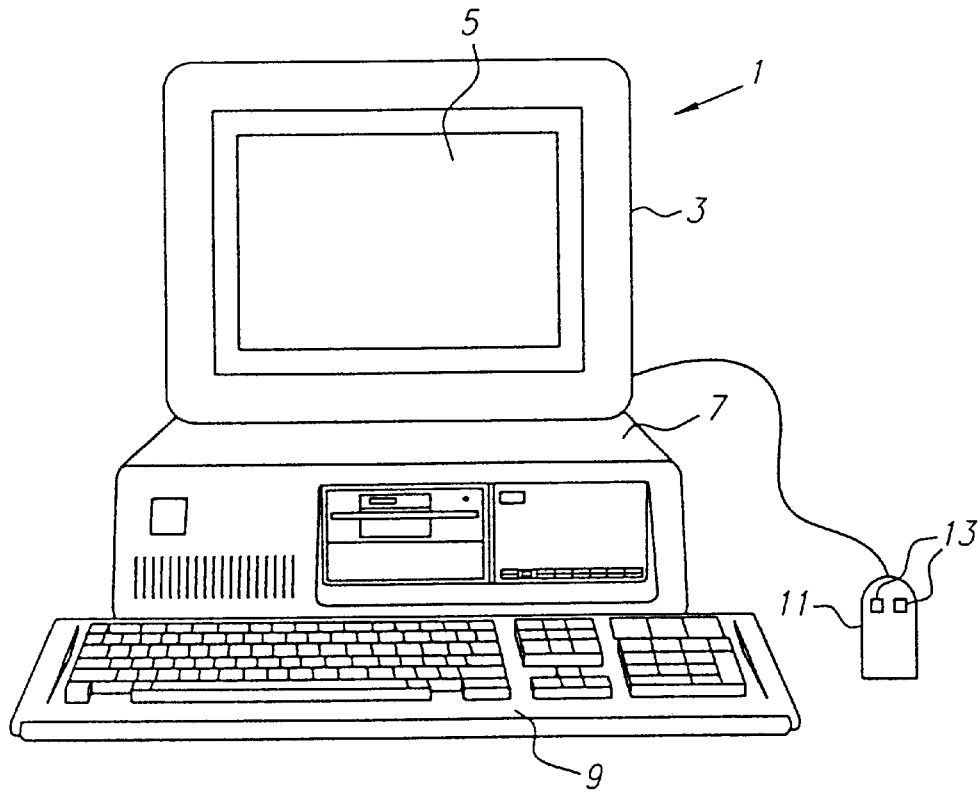
FIG. 9 is an illustration of a computer system suitable for use with the emulation system compiler of the present invention.

FIG. 9 is an illustration of a computer system suitable for use with the emulation system compiler of the present invention. FIG. 9 depicts but one example of many possible computer types or configurations capable of being used with the present invention. FIG. 9 shows computer system 1 including display device 3, display screen 5, cabinet 7, keyboard 9 and mouse 11. Mouse 11 and keyboard 9 are "user input devices." Other examples of user input devices are a touch screen, light pen, track ball, data glove, etc.

Figure 10:
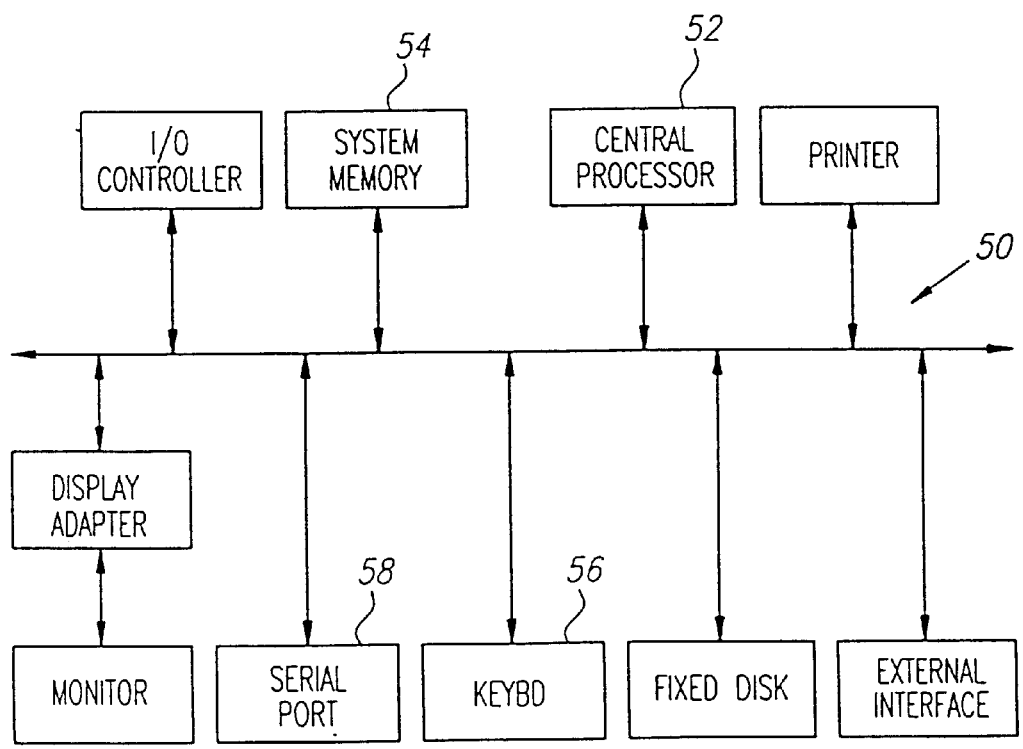
FIG. 10 is an illustration of basic subsystems in the computer system of FIG. 9.

FIG. 10 is an illustration of basic subsystems in computer system 1 of FIG. 9. In FIG. 10, subsystems are represented by blocks such as central processor 52, system memory 54, etc. The subsystems are interconnected via a system bus 50. Additional subsystems such as a printer, keyboard, fixed disk and others are shown. Other arrangements of subsystems and interconnections are possible.

The compiler accepts an electronic description of circuit 300 as input. In the preferred embodiment, many formats for the electronic description of a circuit are accepted such as the Verilog hardware description language. The compiler performs steps of "technology mapping" the circuit to map operations of the circuit to processors within the emulation system. The operations are converted to equations that one or more processors can solve within one cycle of the emulated circuit. The compiler also performs the step of "scheduling" the solution of the equations to insure that the results of equations that are needed as inputs to other equations are obtained before the other equations are executed. The steps of technology mapping and scheduling are performed advantageously in the present invention by making use of the uniform logic units and routing architecture described in section I, above.

The compiler uses the results of the technology mapping and scheduling steps to output an emulation program that is loaded into the control store, multiplexer select RAM and other portions of the emulation system to control the emulation system to solve the equations. Note that the solution of the equations is performed by executing up to 64 program steps within a single emulated clock period (i.e., the period of CLOCK in FIG. 8B). The source code defining the technology mapping and scheduling steps of the compiler is included as Appendix A to this specification. The compilation procedure is made more efficient due to the uniform connectivity of signals in the emulation system resulting in a "flat" programming model. This insures that, after technology mapping, subsequent scheduling steps will not affect the routability of the design being emulated. In other words, the technology mapping and scheduling steps are completely independent of the routing phase of the compilation and of each other.

Figure 11:
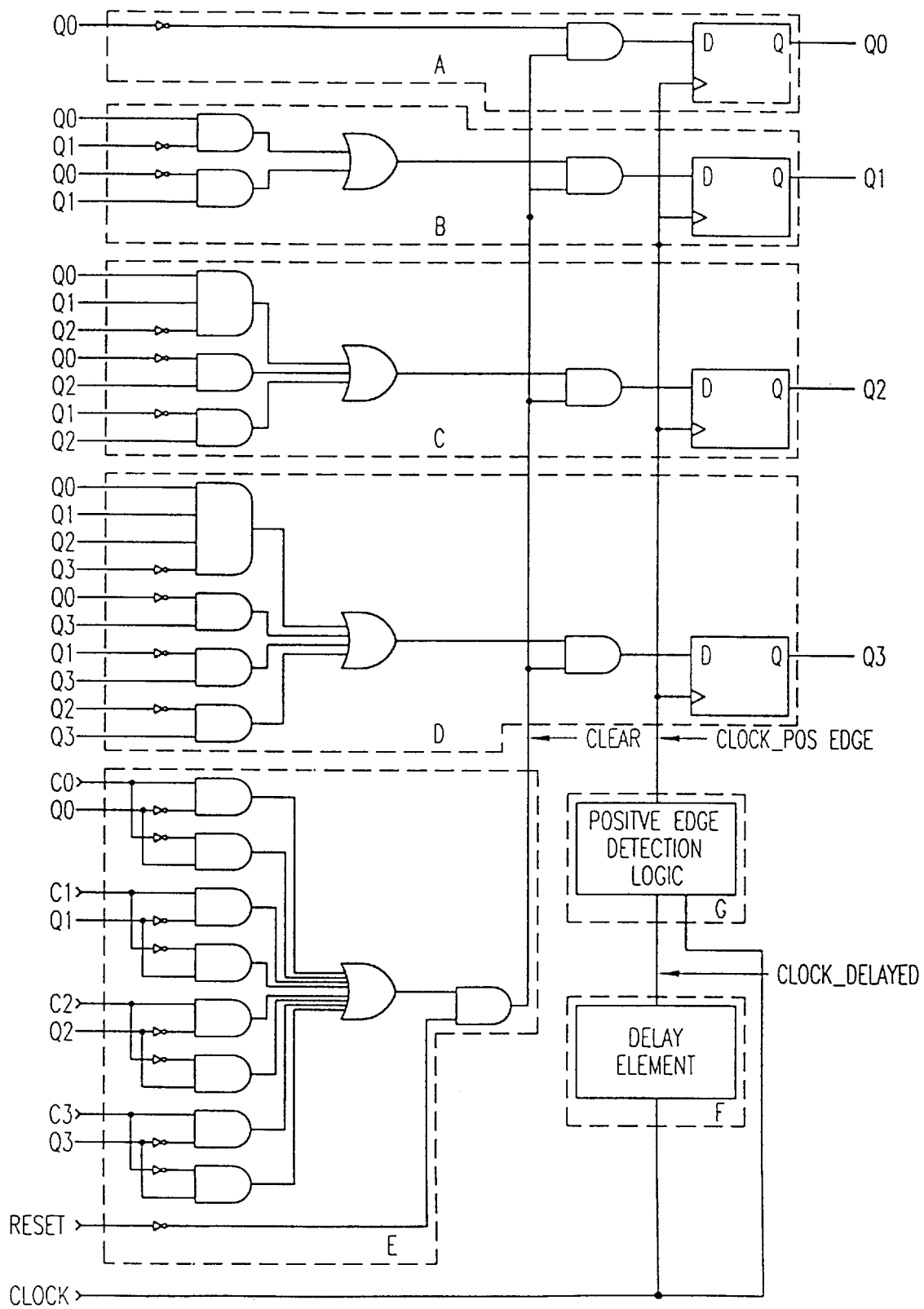
FIG. 11 shows a technology mapping of the circuit of FIG. 8A.

FIG. 11 shows a technology mapping of the circuit of FIG. 8A. In FIG. 11, the circuit has been divided into 7 logic functions labeled A–G. Note that each logic function is a sub-function in the operation of the circuit of FIG. 11, and each logic function can be realized by one logic processor. Each sub-function has clearly defined inputs and outputs and can be computed within each emulation clock cycle, or program step. At most, there are three logic "stages," or dependencies on signals that could arrive at different times in an emulation cycle.

The circuit of FIG. 8A is simple enough that the technology mapping and scheduling can be accomplished manually as in the diagram of FIG. 11. For purposes of illustration, seven logic functions are chosen in this example. Note that logic functions F and G include functionality that has been added to the circuit. This functionality accurately accounts for edge transitions in the clock signal, CLOCK. Since the registers which generate Q0–3 are positive edge sensitive, logic functions F and G include an emulated delay element coupled to emulated positive edge detection logic to generate a signal indicating a positive CLOCK edge transition.

FIG. 12 shows assignments of the logic functions to logic processors (there are 32 logic processors, or 8 logic units, per chip, as discussed above in connection with the architecture of FIGS. 1–7), the inputs to each logic function, the earliest time that an input is needed (given in program steps), the output of the logic function and the latest time at which the logic function's output must be available. For the present example, each logic function in FIG. 11 is assigned to a separate processor. Each HLU has the ability to form four discrete sum-of-product terms and produce four outputs (i.e., four processors). So, for example, a single HLU can be used to handle logic functions A–D while a second HLU can handle logic functions E, F and G. However, as discussed below, the present example allows for a single HLU to handle all of the computations within three's program steps. Because of the uniformity of routing in the emulator the assignments of HLUs, and processors within HLUs, are completely arbitrary with respect to routability.

Returning to FIG. 12, logic function A includes signals Q0, CLEAR and CLOCK_POSEDGE. Signals Q0 and CLEAR are inputs from the user's external circuitry that are interfaced to the emulation system as they would be with the actual circuit under emulation. Signal CLOCK_POSEDGE is generated as an output from logic function G to indicate the clock rising edge. Note that CLOCK_POSEDGE is generated from the signal CLOCK which is the user's clock from the circuit being emulated. In logic function A, signal Q0 is needed at program step 0, signal CLEAR is needed at program step 2 while signal CLOCK_POSEDGE is also needed at program step 2. Logic function A's output is Q0 which must be generated, at the latest, by the next program cycle.

In the present example there are only three program steps, occupying "timeslices" 0, 1 and 2. Each program step is performed during one clock period of the emulator clock. The emulator clock is generally operated as fast as possible since, inevitably, an emulated circuit is designed to be operated at a speed greater than the speed of the emulation program cycle. As mentioned, program steps can be extended to up to four emulator clock cycles where, for example, delays in the emulator require that the emulation system remain in a predetermined state, corresponding to a specific program step, for more than one cycle.

In FIG. 12, the remaining logic functions B–G are designated similarly to logic function A.

FIG. 13 shows assignments of logic processors to timeslices and bus wires. For example, output value Q0 is assigned to timeslice 2 and bus wire 355. As discussed above, there are 384 bus wires (0 through 383) that are inputs to the 48:1 selectors. Bus wires 352 through 383 contain results which originate from logic units 0–7. The present example circuit design uses logic unit 0 exclusively and all of the signals are generated and used within a single chip containing the logic unit. In this case, no inter-chip data exchanges are necessary for the emulation. Note that signals CLEAR, CLOCK_DELAYED and CLOCK_POSEDGE are generated in timeslice 1 while signals Q0–3 are generated in timeslice 2.

FIG. 14 shows the assignment of inputs to bus wires. The signals C0–3, RESET and CLOCK represent the six external inputs to the emulator. Each of the inputs are assumed available and valid at the beginning of the program cycle, i.e., at program step 0, when they are sampled.

FIGS. 13 and 14 represent the results of the scheduling step in the compilation process. The scheduling problem is to ensure that output values that are needed for a given calculation are available before the calculation requires the value. In other words, any calculation necessary to generate a value must be performed, or scheduled, ahead of the time that a subsequent calculations can use the value. This is a trivial problem in the present simple example, the solution of which is presented in FIGS. 13 and 14, but can be a very time consuming step in the compilation procedure where the circuit being emulated is large. An advantage of the present invention is that, contrary to prior emulation systems and compilers, the scheduling step does not influence the routability of the emulated design. This is due, in part, to the processors being fungible commodities in the emulation system of the present invention because there is no advantage to using a given processor over another in terms of input or output routing capability since all of the routing at the Hydra chip level is uniform among the processors.

Figure 15:
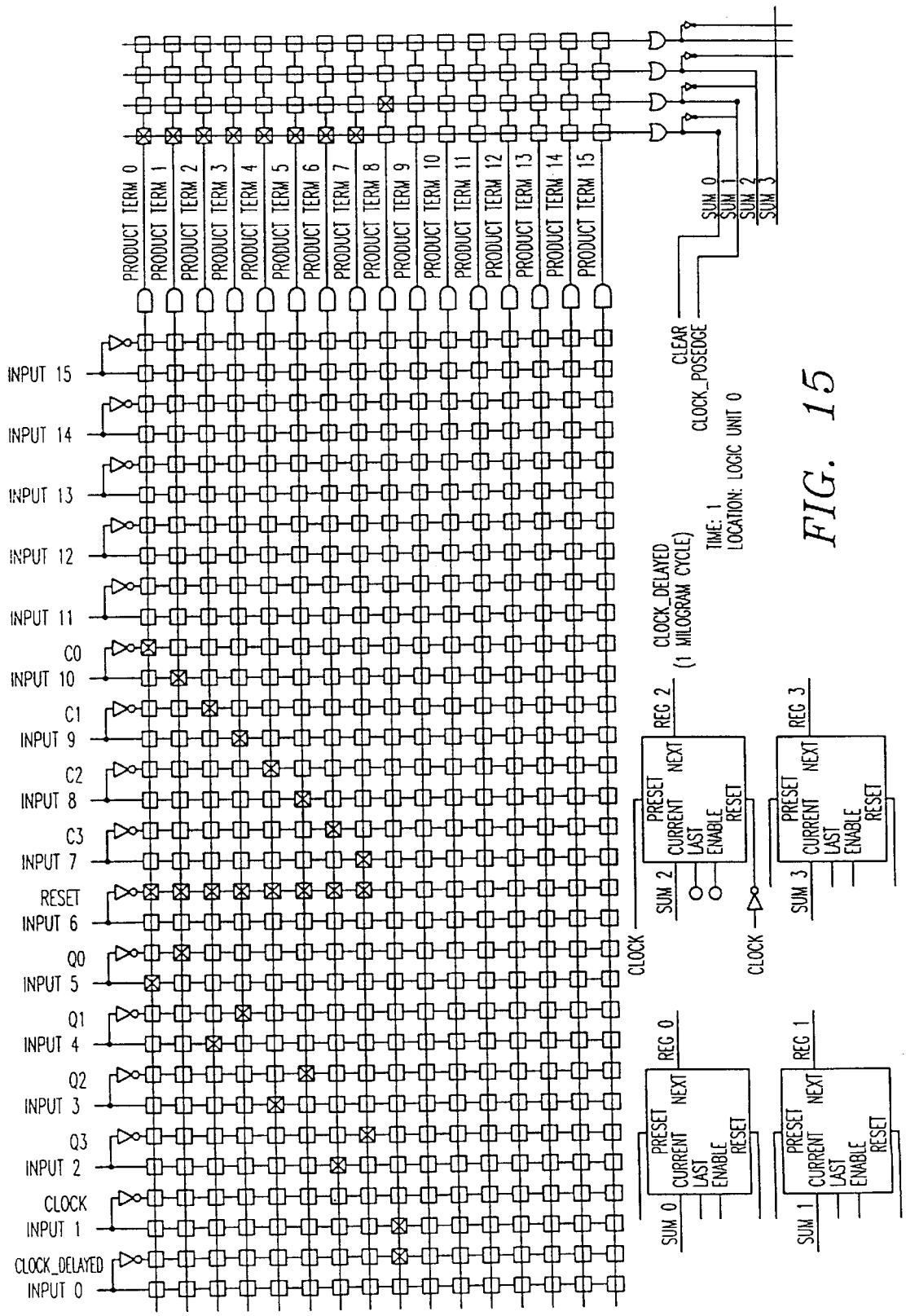
FIG. 15 is an input/output mapping for processors in timeslice 1.
Figure 16:
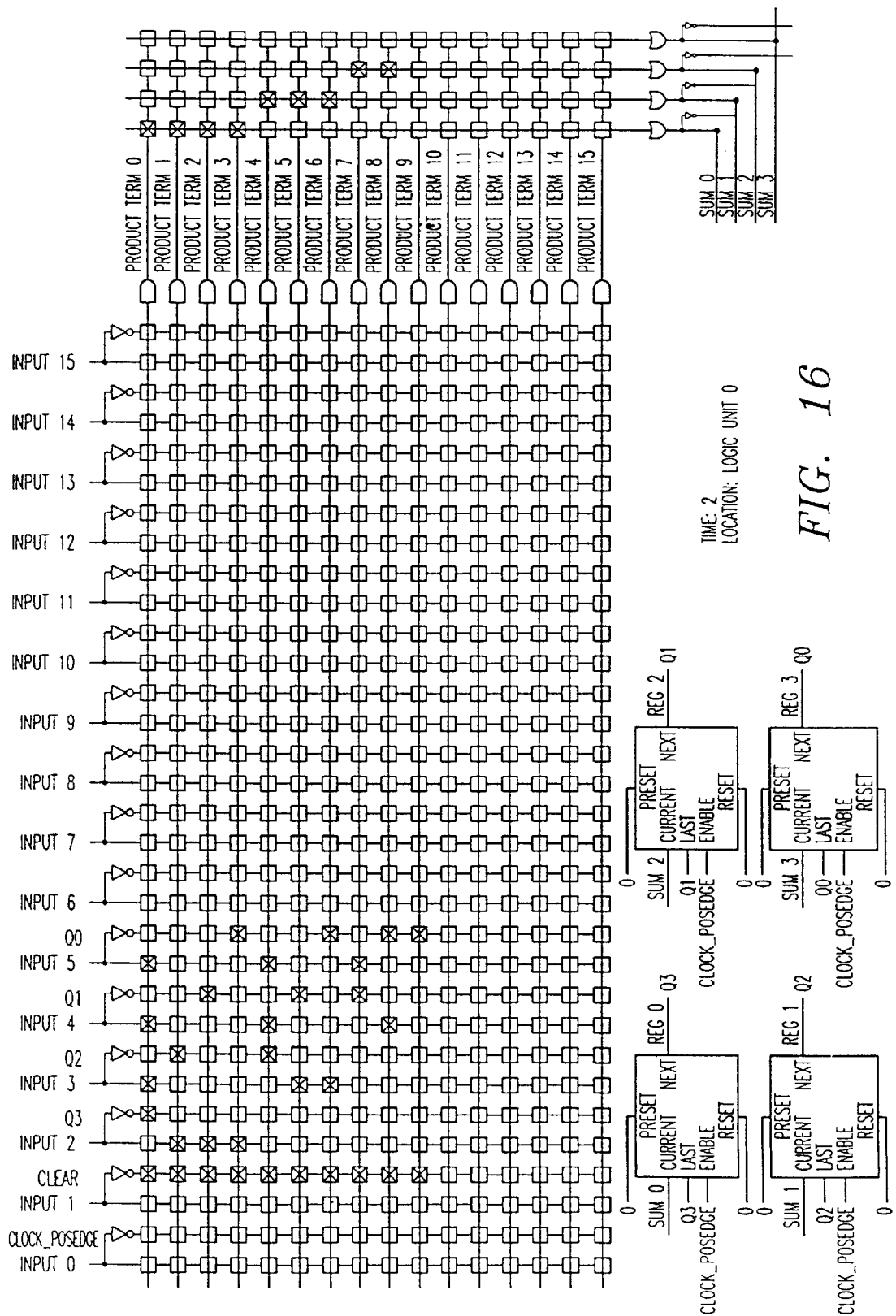
FIG. 16 is an input/output mapping for processors in timeslice 2.

FIGS. 15 and 16 show input and output mappings for the different processors in timeslices 1 and 2, respectively. Thus, it can be seen that, in FIG. 15, the signals CLEAR, CLOCK_DELAYED and CLOCK_POSEDGE are generated from the values C0–3, RESET, Q0–3, CLOCK and CLOCK_DELAYED. The output CLOCK_DELAYED is generated by using register emulation logic such as that shown at 220 of FIG. 4. Similarly, FIG. 16 shows the mapping for signals computed in timeslice 2.

FIGS. 17 and 18 show the mux settings for the 1K:1 selectors that are relevant for the processing of the present example. No settings are shown for timeslice 0 since the signals are not required for logic processing until timeslice 1.

FIGS. 19–21 show the mux settings for the 48:1 muxes in timeslices 0, 1 and 2.

In the foregoing specification, the invention has been described with reference to a specific exemplary embodiment thereof. It will, however, be evident that various modifications and changes may be made without departing from the broader spirit and scope of the invention as set forth in the appended claims. Many such changes or modifications will be readily apparent to one of ordinary skill in the art. The specification and drawings are, accordingly, to be regarded in an illustrative rather than a restrictive sense, the invention being limited only by the provided claims.

What is claimed is:

1. An emulation system for emulating a circuit design, wherein the emulation system includes a logic processor for solving equations to emulate the circuit design, wherein the logic processor includes logic processor inputs and logic processor outputs, the emulation system comprising:

a first selector having first selector inputs and first selector outputs, wherein one or more outputs from the logic processor are coupled to the first selector inputs wherein the first selector selects a subset of signals at the first selector inputs and applies the selected signals to the first selector outputs;

a register having register inputs and register outputs, wherein the register inputs are coupled to the outputs of the first selectors, wherein the register stores the signals received from the selectors;

a second selector having second selector inputs and second selector outputs, wherein the second selector inputs are coupled to the register outputs for selectively applying the register outputs to the second selector outputs;

wherein the inputs of the logic processor are coupled to the outputs of the second selectors;

wherein the first selector includes 256 48:1 multiplexers;

wherein the register includes 256 shift registers, each having an input and an output, wherein the outputs from the 48:1 multiplexers in the first selector are coupled to the shift registers one-to-one, wherein the shift registers each have 64 stages and 64 bits of parallel output lines for a total of 64×256=16,384 shift register parallel output lines;

wherein the second selector includes 128 1024:1 multiplexers coupled to the shift register parallel output lines so that groups of 8 1024:1 selectors receive the same 1024 outputs from a group of 16 shift registers; and Wherein the logic processor includes 8 processors, wherein each processor includes 16 inputs, wherein the processor inputs are coupled to the outputs of the 128 1024:1 multiplexers so that the 128 1024:1 multiplexers are coupled to processors according to an assignment modulo 16.

* * * * *